(12) United States Patent
Buckley et al.

(10) Patent No.: US 11,652,494 B1
(45) Date of Patent: May 16, 2023

(54) DISCRETE OFFSET DITHERED WAVEFORM AVERAGING FOR HIGH-FIDELITY DIGITIZATION OF REPETITIVE SIGNALS

(71) Applicants: Lawrence Livermore National Security, LLC, Livermore, CA (US); Tektronix, Inc., Beaverton, OR (US)

(72) Inventors: Brandon Walter Buckley, Walnut Creek, CA (US); Ryan Douglas Muir, Livermore, CA (US); Daniel G. Knierim, Beaverton, OR (US)

(73) Assignees: LAWRENCE LIVERMORE NATIONAL SECURITY, LLC, Livermore, CA (US); TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 17/555,226

(22) Filed: Dec. 17, 2021

(51) Int. Cl.
*H03M 1/20* (2006.01)
*H03M 1/12* (2006.01)

(52) U.S. Cl.
CPC ............ *H03M 1/201* (2013.01); *H03M 1/124* (2013.01)

(58) Field of Classification Search
CPC ................................ H03M 1/201; H03M 1/124
See application file for complete search history.

(56) References Cited

U.S. PATENT DOCUMENTS

| | | | | |
|---|---|---|---|---|
| 4,813,057 A * | 3/1989 | Fullerton | ............. | H04L 27/103 375/259 |
| 5,811,808 A * | 9/1998 | Cannata | ................. | H04N 5/374 348/E5.081 |
| 5,812,081 A * | 9/1998 | Fullerton | ................. | H01Q 9/28 342/21 |
| 5,952,956 A * | 9/1999 | Fullerton | ............. | H04L 27/103 342/21 |
| 5,969,663 A * | 10/1999 | Fullerton | ................. | H01Q 9/28 342/21 |
| RE41,479 E * | 8/2010 | Fullerton | ................. | H01Q 9/28 342/21 |
| 2002/0196176 A1 * | 12/2002 | Fullerton | ................ | G01S 7/282 342/21 |
| 2003/0016157 A1 * | 1/2003 | Fullerton | ............. | H01Q 21/061 342/21 |
| 2006/0220948 A1 * | 10/2006 | Fullerton | ................. | H01Q 9/28 342/175 |

* cited by examiner

*Primary Examiner* — Lam T Mai
(74) *Attorney, Agent, or Firm* — Perkins Coie LLP

(57) ABSTRACT

Methods and devices for digitizing an analog repetitive signal using waveform averaging are described. An example method includes generating a discrete set of analog dither offset voltages, wherein at least two of the discrete set of analog dither offset voltages are different from each other, receiving the analog repetitive signal comprising multiple instances of a waveform, wherein the waveform has a waveform duration, generate a timing alignment to align each waveform of the analog repetitive signal and the corresponding analog dither offset voltage over the waveform duration, combining, based on the timing alignment, each waveform and the corresponding analog dither offset voltage over the waveform duration to produce an analog output signal, converting the analog output signal to a digital output signal, and producing, based on the timing alignment, a digital averaged signal based on averaging the multiple instances of the waveform in the analog output signal.

20 Claims, 5 Drawing Sheets

DISCRETE OFFSET DITHERED WAVEFORM AVERAGING FOR HIGH-FIDELITY DIGITIZATION OF REPETITIVE SIGNALS

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This document relates to digitization of analog signals and particularly to digitization of analog repeating signals.

BACKGROUND

High fidelity characterization of repetitive waveforms is important for many applications, wherein the goal is to determine, with minimal noise and distortion, the common shape shared across multiple repeating waveforms. However, existing techniques are unable to effectively mitigate the effect of correlated noise and distortion across the repeated waveforms. Thus, there is a need for devices and methods that are able to improve the characterization of repetitive waveforms.

SUMMARY

Embodiments of the disclosed technology relate to discrete offset dithered waveform averaging. In some example aspects of the technology, a signal under test, consisting of a train of repeating waveforms, is combined with a dither, consisting of a sequence of discrete time varying offsets synchronized with the waveforms. The addition of dither offsets serves to decorrelate certain distortions such as analog-to-digital converter (ADC) differential and integral nonlinearity. Among other features and benefits, the disclosed embodiments reduce the impact of correlated distortions accrued during analog to digital conversion, which results in a higher fidelity measurement of the average waveform of the signal under test. The disclosed embodiments can, for example, be used in many fields including optical pulse shaping, repetitive waveform characterization, and telecommunications.

The disclosed embodiments include systems, devices and methods for digitizing an analog repetitive signal using waveform averaging. In an example aspect, an apparatus for improving digitization of an analog repetitive signal includes a discrete offset dither source configured to generate a discrete set of analog dither offset voltages, wherein at least two analog dither offset voltages of the discrete set of analog dither offset voltages are different from each other, an adder circuit, coupled to the discrete offset dither source, configured to receive the analog repetitive signal comprising multiple instances of a waveform, wherein the waveform has a waveform duration, receive the discrete set of analog dither offset voltages, wherein each analog dither offset voltage is substantially constant over the waveform duration, and combine each waveform and the corresponding analog dither offset voltage over the waveform duration based on a timing alignment, a timing detector, coupled to the discrete offset dither source, configured to generate the timing alignment to align each waveform of the analog repetitive signal and the corresponding analog dither offset voltage over the waveform duration, an analog to digital converter, coupled to the adder circuit, configured to receive an analog output signal from the adder circuit and convert the analog output signal to a digital output signal, and a synchronized averaging circuit, coupled to the analog to digital converter and the timing detector, configured to receive the digital output signal and produce, based on the timing alignment, a digital averaged signal.

In another example aspect, method for improving digitization of an analog repetitive signal includes generating a discrete set of analog dither offset voltages, wherein at least two analog dither offset voltages of the discrete set of analog dither offset voltages are different from each other, receiving the analog repetitive signal comprising multiple instances of a waveform, wherein the waveform has a waveform duration, generate a timing alignment to align each waveform of the analog repetitive signal and the corresponding analog dither offset voltage over the waveform duration, combining, based on the timing alignment, each waveform and the corresponding analog dither offset voltage over the waveform duration to produce an analog output signal, converting the analog output signal to a digital output signal, and producing, based on the timing alignment, a digital averaged signal based on averaging the multiple instances of the waveform in the analog output signal.

In yet another example aspect, an apparatus for improving digitization of an analog repetitive signal includes means for generating a discrete set of analog dither offset voltages, wherein at least two analog dither offset voltages of the discrete set of analog dither offset voltages are different from each other, means for summing two signals configured to receive the analog repetitive signal comprising multiple instances of a waveform, wherein the waveform has a waveform duration, receive the discrete set of analog dither offset voltages, wherein each analog dither offset voltage is substantially constant over the waveform duration, and combine each waveform and the corresponding analog dither offset voltage over the waveform duration based on a timing alignment, means for generating the timing alignment to align each waveform of the analog repetitive signal and the corresponding analog dither offset voltage over the waveform duration, means for converting an analog signal to a digital signal configured to receive an analog output signal from the means for summing and convert the analog output signal to a digital output signal, and means for averaging configured to receive the digital output signal and produce, based on the timing alignment, a digital averaged signal.

DETAILED DESCRIPTION

Figure 1:
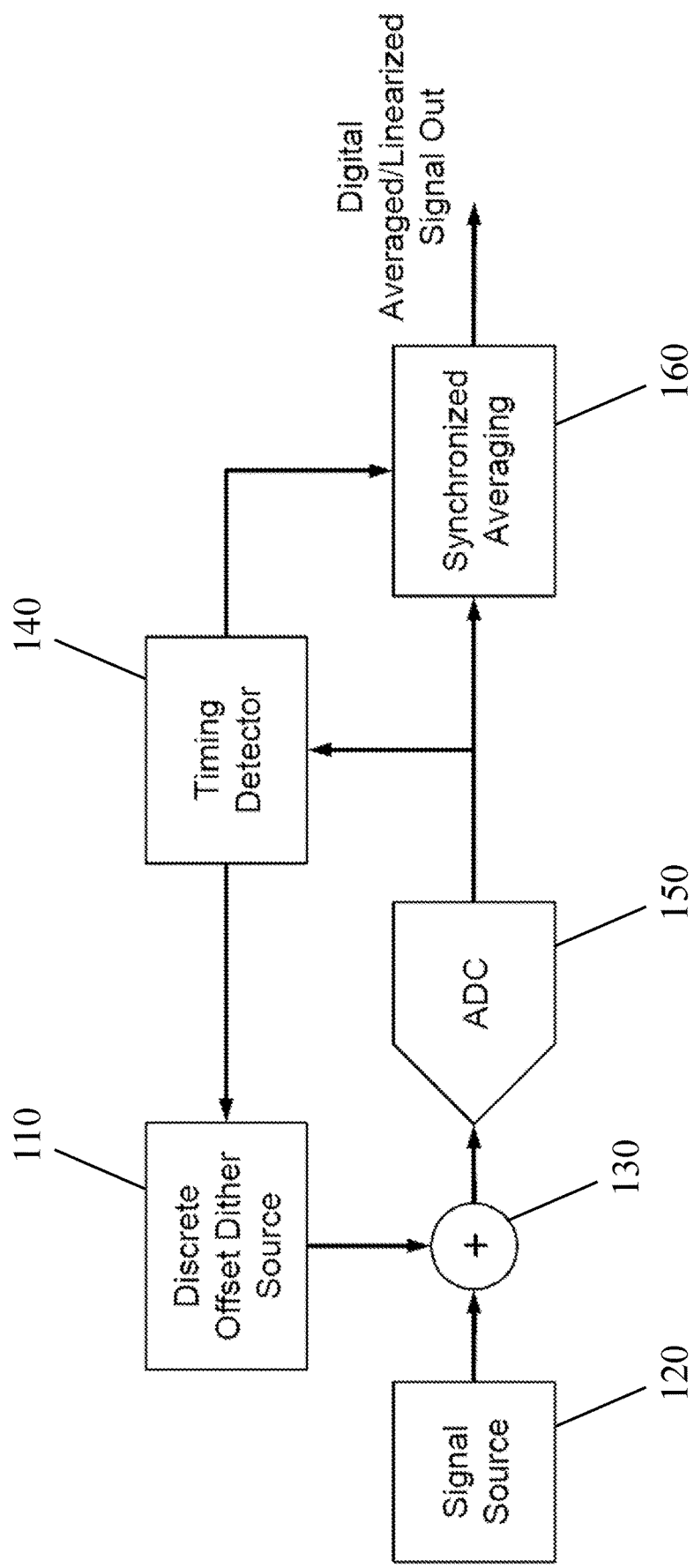
FIG. 1 is a block diagram illustrating an example system for the improved digitization of an analog repetitive signal.

The ability to characterize repetitive waveforms, which are often used in optical pulse shaping and telecommunications, with high fidelity is becoming increasingly important. The goal is to determine, with minimal noise and distortion, the waveform shape that is commonly shared across multiple repeating waveforms. Digital waveform averaging is a known technique to reduce uncorrelated noise present in the measured signal. Uncorrelated error is that which is not common across different waveforms. In conventional digital waveform averaging, multiple digitized waveforms are temporally aligned, and at each sample point the corresponding values from each waveform are averaged. In so doing, the root mean square deviation of uncorrelated noise is reduced by a factor equal to the square root of the number of averaged waveforms. Meanwhile, the value common to each repeated waveform persists with averaging. The result is a higher signal-to-noise ratio (SNR) measurement of the waveform under test.

While waveform averaging is effective at mitigating uncorrelated noise, it is unable to differentiate the signal of interest from correlated noise and distortion. Correlated noise and distortion are errors which are common across all waveforms. An important source of such distortion is due to non-linearity in the ADC transfer function. An ADC works by dividing the full-scale range into a non-overlapping set of contiguous bins, such that every input level lies in a unique bin. The ADC transfer function assigns a unique digital code to each bin. Ideally, the bin widths are uniform, with an ideal bin width, termed a least significant bit (LSB), equal to the full-scale range divided by the number of bins. However, in practice, imperfections arise, leading to non-uniformities in the bin width and thus a non-linear transfer function. The deviation in width of each bin from the ideal is termed differential nonlinearity (DNL), and the accumulated deviation is termed integral non-linearity (INL). Typical DNL values are a fraction of a LSB and the total accumulated INL can be on the order of several LSBs. Although this error may be small relative to the total number of ADC bins, it can still have a big impact, especially when attempting to measure small features with a high relative fidelity. DNL/INL errors are typically static and do not change across different instances of the repetitive signal. Therefore, waveform averaging alone cannot be used to improve this source of distortion.

One method to decorrelate the errors from DNL/INL is to take advantage of the fact that the magnitude and sign of the error changes depending on the bins in which the signal is digitized. By applying a time varying offset to the incoming signal under test, corresponding points on different waveforms will no longer land in the same ADC bin. The error from DNL/INL is therefore no longer common across waveforms and can be reduced with waveform averaging. Provided that these intentional dithering offsets can be removed by post-processing, the original waveform can therefore be recovered with higher fidelity. Applying a time varying offset in this way, typically termed dithering, is a known technique for improving the linearity of ADCs. However, it comes with a variety of engineering performance tradeoffs. Adding dither to a signal under test requires reduced signal amplitude to allow room for the overhead for the dither waveform, resulting in lower SNR. Additionally, the dither can act as a source of distortion unless it is compensated for. Multiple techniques exist to remove the dither from the measured waveforms in post processing, including subtraction and filtering, but all come with drawbacks, added complexity, and potentially residual errors.

Embodiments of the disclosed technology utilize dithering with waveform averaging in specific ways that result in new strategies for mitigating the performance tradeoffs of dithering that have not been previously considered in conventional techniques. In an example, the discrete dither offsets can be designed to have a zero average offset value, so that no residual error remains after averaging. In another example, the SNR reduction due to the overhead required when dithering does not lead to lower system performance since it can be mitigated with further averaging. The overall synergistic combination of dithering and averaging results in a signal averaging system that is not limited by correlated noise and distortion.

FIG. 1 is a block diagram illustrating an example system for the improved digitization of an analog repetitive signal. As shown therein, the system includes a discrete offset dither source (or "dither source" for simplicity) 110, a signal source 120, an adder circuit (or summation block) 130, a timing detector 140, an analog-to-digital converter (ADC) 150, and a synchronized averaging circuit 160.

The signal source 120 is configured to generate a signal of interest (or analog input signal), which includes a repeating sequence of waveforms, and the dither source 110 is configured to generate a discrete set of dither offsets. The repeating sequence of waveforms and the discrete set of dither offsets are combined using the adder circuit 130. In an example, the dither offset is an analog dither offset voltage, and the adder circuit shifts the waveform in the DC domain by the dither offset voltage corresponding to that waveform.

In some embodiments, some or all of the circuit components can be implemented using hardware devices, e.g., a field programmable gate array (FPGA) or an application specific integrated circuit (ASIC). In some embodiments, at least some of the components or associated operations can be implemented using a processor (e.g., a microprocessor, a controller, etc.) that can be configured to perform the disclosed operations upon execution of a program code or instructions that are stored, and retrieved from a memory. In some embodiments, the adder circuit can be implemented using a summing operational amplifier circuit. In other embodiments, the adder circuit includes a differential amplifier. In this latter example, the signal under test can be applied to the positive input of the differential amplifier, while the dither can be applied to the negative input. Such a configuration can be found in many measurements systems as a method for providing a DC offset to a signal under test. In such systems, this DC offset circuit can be used to supply the dither, provided it has the requisite resolution and sufficiently low settling time.

In some embodiments, and in order to achieve synchronization, the dither source must receive the timing information from a timing detector. The timing detector 140 determines the starting point of each waveform in the repeating sequence of waveforms, and that information is used to synchronize and align the dither offsets with the waveforms, as well as temporally aligning the waveform prior to averaging. The ADC 150 digitizes the summation of the analog input signal and the dither offsets so that it can be digitally processed and/or stored. The synchronized averaging circuit 160 is configured to perform an averaging operation on a certain number of measured waveforms. The averaging operation uses the starting times from the timing detector, and temporally aligns each digitized waveform plus dither offset and then averages all the measured values at each sample point.

In some embodiments, the timing detector 140 can be implemented using a voltage detection circuit, which is configured to determine a start time of the waveform based on the energy in the waveform exceeding a predetermined threshold. In other embodiments, an external trigger signal can be used to implement the timing detector.

In some embodiments, the ADC 150 can be implemented using a sample-and-hold circuit, which receives an analog input signal and holds a particular value of the analog input signal for a predefined duration. The output of the sample-and-hold circuit is quantized and encoded to generate a digital (or digitized) signal that is representative of the analog input signal, and depends on the resolution of the quantizer used. A higher number of bits used in the quantizer corresponds to a more accurate representation of the analog input signal. In some examples, the ADC can be implemented as a flash (or parallel) ADC, a dual slope ADC, or a successive approximation ADC.

In some embodiments, the synchronized averaging circuit implements an averaging operation on a predefined number of digitized waveforms. In other embodiments, a weighted average can be implemented by the synchronized averaging circuit. In an example, the weights of the weighted average may be based on the level of noise or an associated metric, e.g., the signal-to-noise ratio (SNR). In other example, the weights may be exponential weights that include higher weights for more recent instances of the waveform, e.g., a forgetting factor.

In some embodiments, the dither source can be composed of a programmable voltage source or a digital-to-analog converter (DAC) that is configured to generate a dither. In an example, the dither is a discrete sequence of constant voltage steps, and the duration of each step is chosen large enough so that each waveform is summed with a dither value constant over the full waveform duration. The voltage level can be varied every waveform, or it can be varied every multiple number of waveforms. In between these constant voltages, when the voltage level is varied, the dither undergoes a transition period due to the finite bandwidth and settling time of the DAC. These transitions can coincide with a deadtime between repeating waveforms. Alternatively, the transitions can coincide with a pre-determined single or multiple number of waveforms of the signal under test. These waveforms coinciding with a transition can be excluded from the final averaging.

The difference between the maximum and minimum dither voltages is termed the dither amplitude and the minimum difference between voltages is termed the dither step size. In some embodiments, the dither amplitude is configured to be large enough and the step size small enough so that the distortion is sufficiently randomized across all captured waveforms.

In some embodiments, random noise in the signal and/or ADC also serves to dither ADC non-linearity. Herein, the dither step size can be configured to remain below approximately 2.5 times the root mean square (rms) Gaussian noise level to enable the random noise to fill in the gaps between the discrete offset dither values. In some examples, a digitizer with 0.2% full-scale rms noise would suggest a 0.5% or smaller dither step size, and for a 10% dither amplitude, 21 or more dither steps may be used. More generally, 16-32 steps may be used.

In some embodiments, the sequence of voltage offsets can be a monotonic increasing staircase. In other embodiments, the sequence of voltage offsets can be a monotonic decreasing staircase. In yet other embodiments, the sequence of voltage offsets can be a randomized sequence of dither values. By randomizing the sequence of dither values, unwanted correlations with baseline wander of the signal under test, which may otherwise reduce the effect of the dither offset, can be avoided. The dither must be synchronized with the signal under test so that the durations of constant voltage can be tailored to match the waveform duration and so that transition times can be controlled to land at the most optimized place in the waveform.

Figure 2:
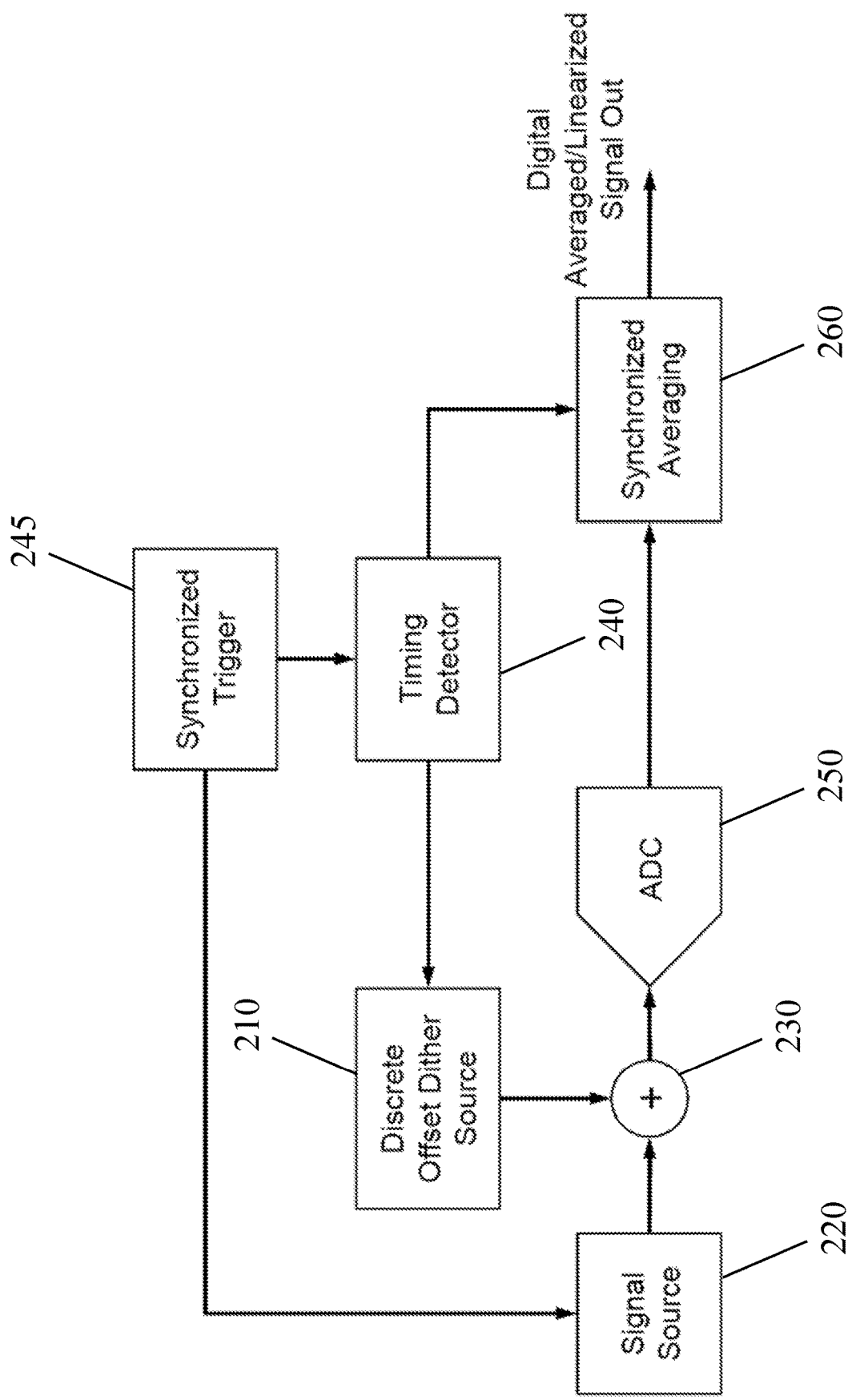
FIG. 2 is a block diagram illustrating another example system for the improved digitization of an analog repetitive signal.

FIG. 2 is a block diagram illustrating another example system for the improved digitization of an analog repetitive signal. This example includes features and/or components that are similar to those shown in FIG. 1, with the addition of a synchronized trigger 245, as described herein. At least some of these features and/or components may not be separately described in this example.

In some embodiments, and as shown in FIG. 2, the system further includes a synchronized trigger 245 which receives an externally-provided trigger signal and triggers a repetition of the waveform from signal source 220 and also triggers the timing detector 240. Alternatively, the timing detector can be triggered off the signal under test itself, either with an analog split of the signal, or on the digitally measured signal directly. It can be advantageous to use an external trigger signal, if such a signal is available, even though it adds complexity. Triggering off an external trigger signal avoids added timing uncertainty due to noise on the signal. It also avoids the requirement for tailoring the threshold level depending on the signal. With a dither added, it can also complicate the situation when the timing detector is triggered off the signal under test, since each waveform will be offset in amplitude and will trigger the timing detector at different relative times in the waveform. In this case, the dither value can be fed to the timing detector to offset the threshold level by the dither amount, though this adds more complexity to the system.

As shown in FIGS. 1 and 2, the digitized signal under test plus dither, along with the timing information of each waveform, is used to perform waveform averaging. The corresponding sample points from each waveform are digitally averaged through accumulation of the corresponding values followed by division by the total number of waveforms. Digital averaging can be performed either in fixed point arithmetic or floating point arithmetic. Fixed point arithmetic is more easily accomplished in real-time on highly parallelized hardware devices, e.g., a field programmable gate array (FPGA) or an application specific integrated circuit (ASIC).

In these implementations, the bit depth of the fixed point arithmetic places a limit on the number of waveforms that can be added together. Once the maximum fixed point value is reached, over flow occurs and resolution is lost, nullifying the impact of further averaging. Floating point, either single or double precision, enables averaging many more waveforms with much higher ultimate resolution. However, floating point is not so easily performed in real-time hardware and is thus typically performed on a central processing unit (CPU) with associated lags. As such, a combination of fixed point and floating arithmetic can be used to balance averaging speed with resolution. For example, accumulation can be performed in fixed point on a limited number of waveforms until the resolution limit is reached. The accumulated values can be stored in memory while the next set of waveforms are accumulated. When the total number of waveforms has been captured, floating point averaging can be performed on the hardware accumulated results stored in memory. Offloading hardware accumulated values to memory can take time, during which accumulation may be stalled, resulting in lost waveforms and increased averaging time. However, this offload time can be coordinated with the transition time of the dither, so that the waveforms being lost during the data transfer are the only ones to experience a non-constant dither offset value.

Figure 3:
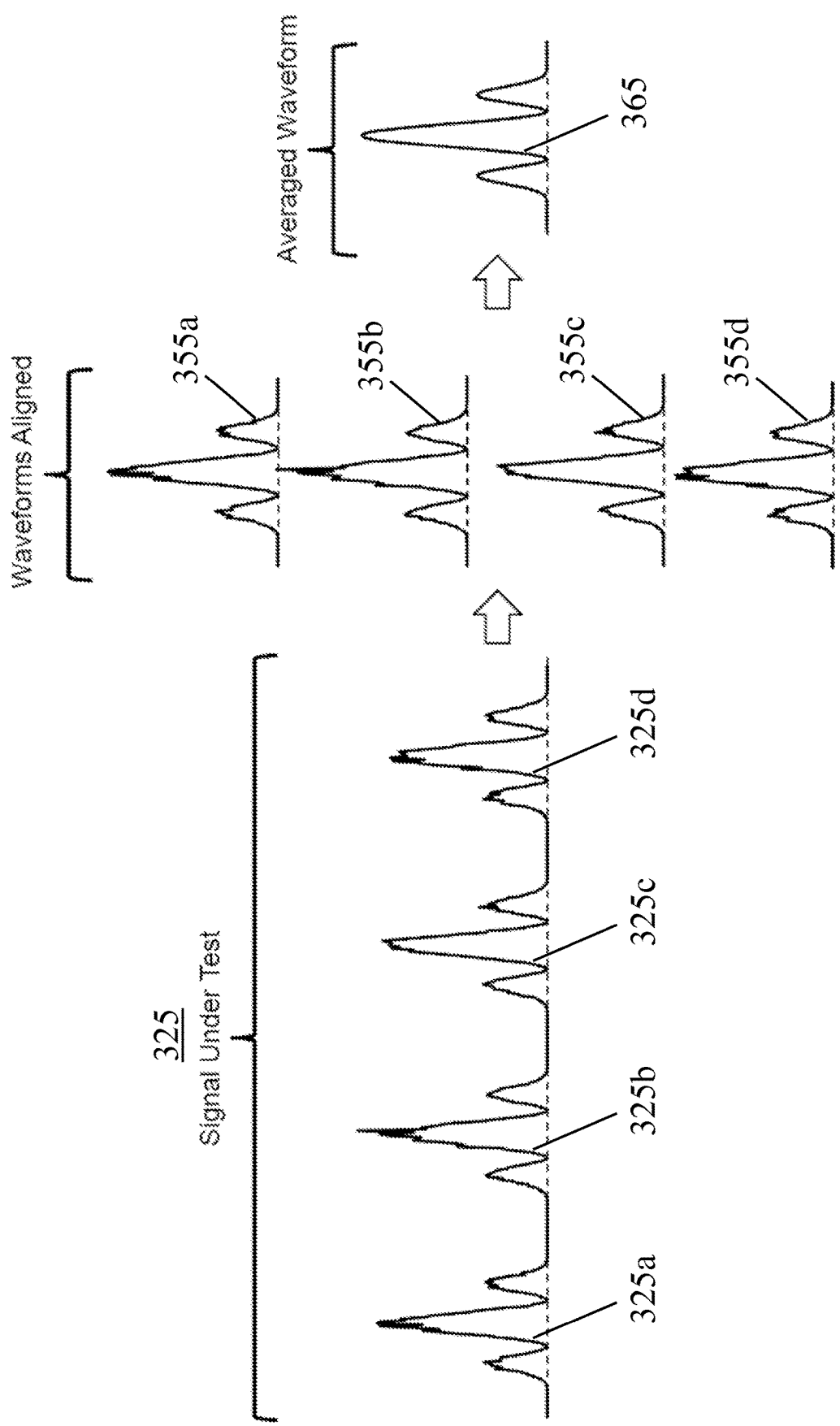
FIG. 3 illustrates an example of waveform averaging technique.

FIG. 3 illustrates an example of waveform averaging without using a discrete offset dither source. As shown therein, the signal under test 325 (which can be generated, for example, by signal source 120 or 220 in FIGS. 1 and 2, respectively) includes multiple repeated waveforms (denoted 325a, 325b, 325c, 325d) with no analog dither offset voltages applied. Each of the multiple repeated waveforms are aligned (denoted 355a, 355b, 355c, 355d) and then used to generate the averaged waveform 365. As discussed previously, the conventional waveform averaging process shown in FIG. 3 can mitigate uncorrelated errors, but cannot compensate for correlated noise and distortion.

Figure 4:
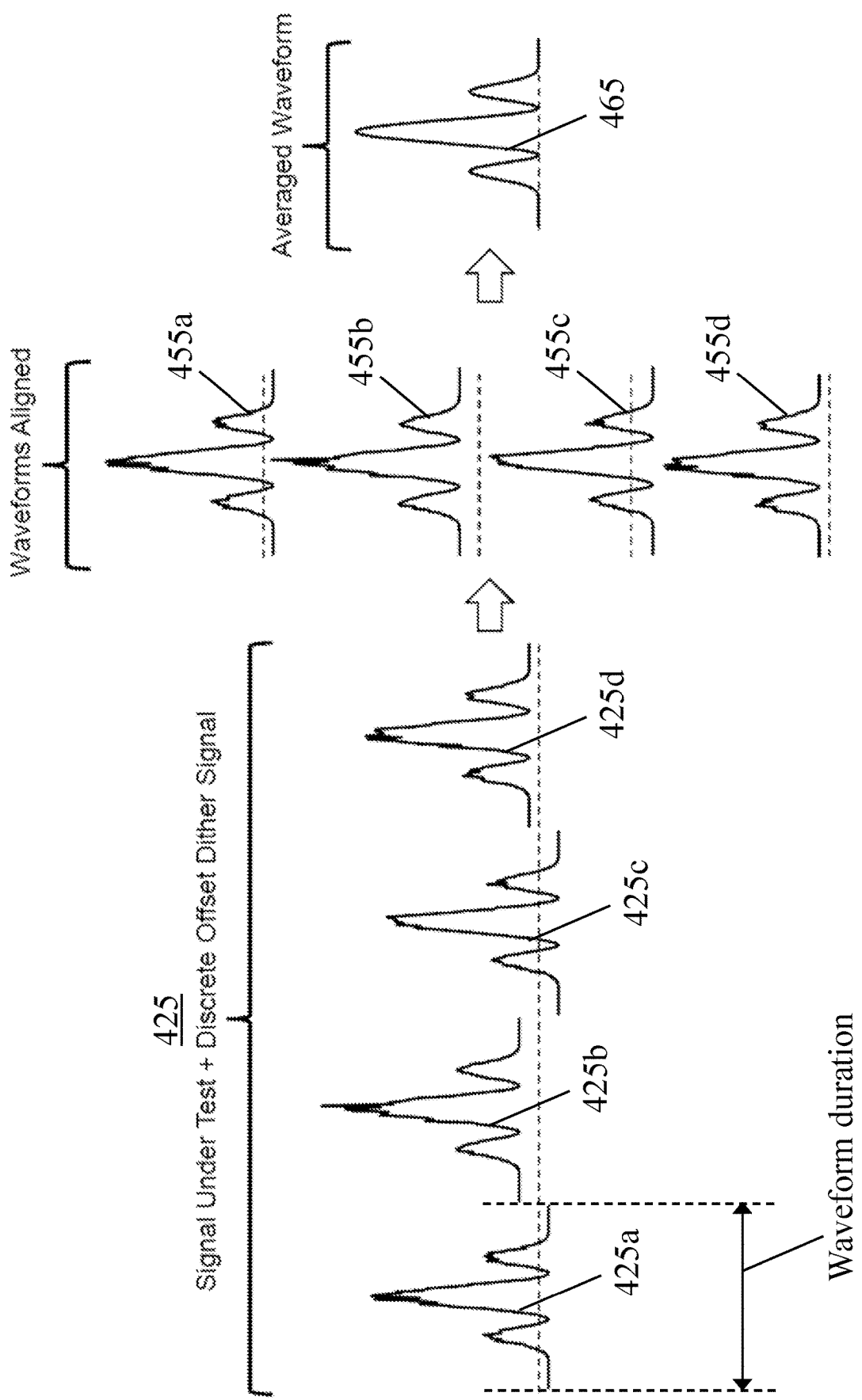
FIG. 4 illustrates an example of waveform averaging technique using a discrete offset dither signal, which improves the digitization of an analog repetitive signal.

FIG. 4 illustrates an example of waveform averaging using a discrete offset dither signal, which improves the digitization of an analog repetitive signal. As shown therein, the discrete offset dither signal is combined with the signal under test (denoted 425) and includes multiple repeated waveforms (denoted 425a, 425b, 425c, 425d), each of which is offset from DC (denoted as the horizontal dashed line) by a distinct substantially constant voltage over the waveform duration. Each of the multiple repeated waveforms, with its corresponding offset dither voltage, is aligned (denoted 455a, 455b, 455c, 455d) and used to generate the averaged waveform 465. As discussed above, using the discrete offset dither signal advantageously enables correlated noise and distortions to be mitigated, which results in a high fidelity characterization of the repeated waveform.

In some embodiments, configuring the dither amplitude is a trade-off between achieving better linearization (the decorrelation of ADC fine-scale non-linearity) and losing signal headroom (to avoid the sum of the signal and dither from clipping the ADC). This trade-off may depend on the specific non-linearity characteristics of the ADC being used and how much SNR impact is acceptable due to the reduced signal amplitude. In some examples, the amplitudes of the offsets from DC may be configured to be 5%-15% of ADC full scale (i.e., the largest signal amplitude that can be delivered to the ADC before the signal is clipped in its digital output representation).

Figure 5:
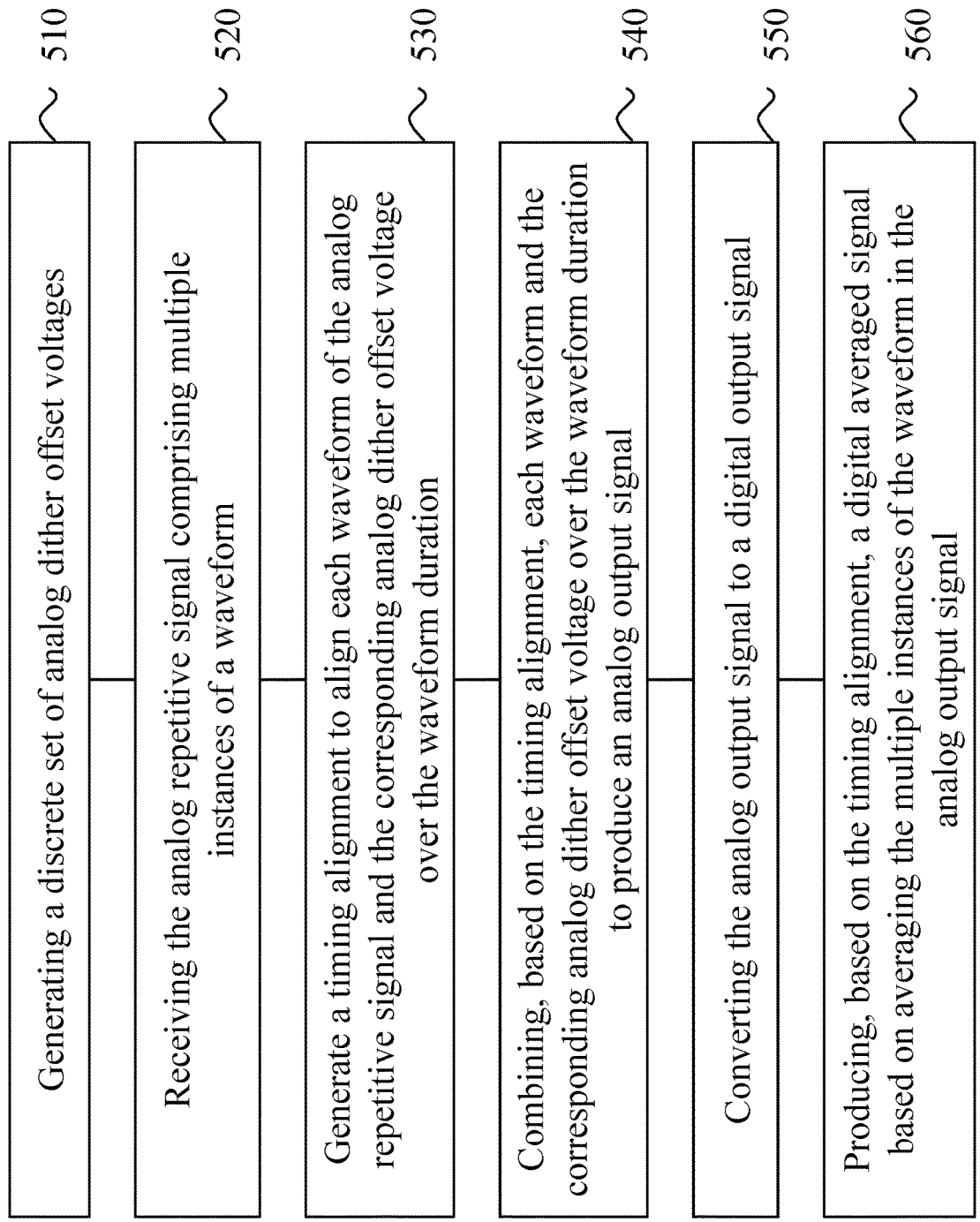
FIG. 5 is a flowchart of an example method for improving digitization of an analog repetitive signal.

FIG. 5 is a flowchart of an example method for improving digitization of an analog repetitive signal. The method 500 includes, at operation 510, generating a discrete set of analog dither offset voltages, wherein at least two analog dither offset voltages of the discrete set of analog dither offset voltages are different from each other.

The method 500 includes, at operation 520, receiving the analog repetitive signal comprising multiple instances of a waveform, wherein the waveform has a waveform duration.

The method 500 includes, at operation 530, generate a timing alignment to align each waveform of the analog repetitive signal and the corresponding analog dither offset voltage over the waveform duration.

The method 500 includes, at operation 540, combining, based on the timing alignment, each waveform and the corresponding analog dither offset voltage over the waveform duration to produce an analog output signal.

The method 500 includes, at operation 550, converting the analog output signal to a digital output signal.

The method 500 includes, at operation 560, producing, based on the timing alignment, a digital averaged signal based on averaging the multiple instances of the waveform in the analog output signal.

In some embodiments, the method 500 further includes the operation of generating the analog repetitive signal.

In some embodiments, the method 500 further includes the operation of receiving a trigger signal synchronized with a start of at least one waveform of the analog repetitive signal, wherein the timing alignment is based on the trigger signal.

In some embodiments, the method 500 further includes the operation of generating a timing information comprising a start time of at least one waveform of the analog repetitive signal, wherein generating the discrete set of analog dither offset voltages is based on the timing information.

In some embodiments, averaging the multiple instances of the waveform uses a combination of fixed-point arithmetic and floating-point arithmetic.

In some embodiments, the analog dither offset voltage is different between consecutive instances of the waveform.

In some embodiments, the analog dither offset voltage is substantially constant for M consecutive instances of the waveform, wherein M is a positive integer that is less than a number of the multiple instances of the waveform. The analog dither offset voltage being substantially constant accounts for residual noise, settling error, drift, and similar implementation artifacts.

In some embodiments, the analog dither offset voltages are monotonically increasing, monotonically decreasing, or randomized.

Embodiments of the disclosed technology include an apparatus for improving digitization of an analog repetitive signal includes a discrete offset dither source configured to generate a discrete set of analog dither offset voltages, wherein at least two analog dither offset voltages of the discrete set of analog dither offset voltages are different from each other, an adder circuit, coupled to the discrete offset dither source, configured to receive the analog repetitive signal comprising multiple instances of a waveform, wherein the waveform has a waveform duration, receive the discrete set of analog dither offset voltages, wherein each analog dither offset voltage is substantially constant over the waveform duration, and combine each waveform and the corresponding analog dither offset voltage over the waveform duration based on a timing alignment, a timing detector, coupled to the discrete offset dither source, configured to generate the timing alignment to align each waveform of the analog repetitive signal and the corresponding analog dither offset voltage over the waveform duration, an analog to digital converter, coupled to the adder circuit, configured to receive an analog output signal from the adder circuit and convert the analog output signal to a digital output signal, and a synchronized averaging circuit, coupled to the analog to digital converter and the timing detector, configured to receive the digital output signal and produce, based on the timing alignment, a digital averaged signal.

In some embodiments, the adder circuit comprises a differential amplifier.

In some embodiments, the analog repetitive signal is applied to a positive input of the differential amplifier and the discrete set of analog dither offset voltages is applied to a negative input of the differential amplifier.

In some embodiments, the adder circuit is a summing operational amplifier circuit.

In some embodiments, the synchronized averaging circuit is configured to average the multiple instances of the waveform using a combination of fixed-point arithmetic and floating-point arithmetic circuits.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

It is understood that at least some of the component of the disclosed embodiments may be implemented individually, or collectively, in devices comprised of a processor, a memory unit, an interface that are communicatively connected to each other. The processor and/or controller can perform various disclosed operations based on execution of program code that is stored on a storage medium. The processor and/or controller can, for example, be in communication with at least one memory and with at least one communication unit that enables the exchange of data and information, directly or indirectly, through the communication link with other entities, devices and networks. The communication unit may provide wired and/or wireless communication capabilities in accordance with one or more communication protocols, and therefore it may comprise the proper transmitter/receiver antennas, circuitry and ports, as well as the encoding/decoding capabilities that may be necessary for proper transmission and/or reception of data and other information.

Various information and data processing operations described herein may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media that is described in the present application comprises non-transitory storage media. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Only a few implementations and examples are described and other implementations, enhancements and variations can be made based on what is described and illustrated in this disclosure.

What is claimed is:

1. An apparatus for improving digitization of an analog repetitive signal, comprising:
   a discrete offset dither source configured to generate a discrete set of analog dither offset voltages, wherein at least two analog dither offset voltages of the discrete set of analog dither offset voltages are different from each other;
   an adder circuit, coupled to the discrete offset dither source, configured to:
     receive the analog repetitive signal comprising multiple instances of a waveform, wherein the waveform has a waveform duration,
     receive the discrete set of analog dither offset voltages, wherein each analog dither offset voltage is substantially constant over the waveform duration, and
     combine each waveform and the corresponding analog dither offset voltage over the waveform duration based on a timing alignment;
   a timing detector, coupled to the discrete offset dither source, configured to generate the timing alignment to align each waveform of the analog repetitive signal and the corresponding analog dither offset voltage over the waveform duration;
   an analog to digital converter, coupled to the adder circuit, configured to receive an analog output signal from the adder circuit and convert the analog output signal to a digital output signal; and
   a synchronized averaging circuit, coupled to the analog to digital converter and the timing detector, configured to receive the digital output signal and produce, based on the timing alignment, a digital averaged signal.

2. The apparatus of claim 1, further comprising:
   a signal source, coupled to the adder circuit, configured to generate the analog repetitive signal.

3. The apparatus of claim 1, wherein the timing detector comprises:
   a trigger circuit configured to receive a trigger signal synchronized with a start of at least one waveform of the analog repetitive signal, wherein the timing alignment is based on the trigger signal.

4. The apparatus of claim 1, wherein the timing detector is further configured, as part of generating the timing alignment, to:
   generate a timing information comprising a start time of at least one waveform of the analog repetitive signal; and
   transmit the timing information to the discrete offset dither source.

5. The apparatus of claim 1, wherein the adder circuit comprises a differential amplifier.

6. The apparatus of claim 5, wherein the analog repetitive signal is applied to a positive input of the differential amplifier and the discrete set of analog dither offset voltages is applied to a negative input of the differential amplifier.

7. The apparatus of claim 1, wherein the adder circuit comprises a summing operational amplifier circuit.

8. The apparatus of claim 1, wherein the synchronized averaging circuit is configured to average the multiple instances of the waveform using a combination of fixed-point arithmetic and floating-point arithmetic circuits.

9. The apparatus of claim 1, wherein the analog dither offset voltage is different between consecutive instances of the waveform.

10. The apparatus of claim 1, wherein the analog dither offset voltage is substantially constant for M consecutive instances of the waveform, wherein M is a positive integer that is less than a number of the multiple instances of the waveform.

11. The apparatus of claim 1, wherein the analog dither offset voltages are monotonically increasing, monotonically decreasing, or randomized.

12. A method for improving digitization of an analog repetitive signal, comprising:
  generating a discrete set of analog dither offset voltages, wherein at least two analog dither offset voltages of the discrete set of analog dither offset voltages are different from each other;
  receiving the analog repetitive signal comprising multiple instances of a waveform, wherein the waveform has a waveform duration;
  generate a timing alignment to align each waveform of the analog repetitive signal and the corresponding analog dither offset voltage over the waveform duration;
  combining, based on the timing alignment, each waveform and the corresponding analog dither offset voltage over the waveform duration to produce an analog output signal;
  converting the analog output signal to a digital output signal; and
  producing, based on the timing alignment, a digital averaged signal based on averaging the multiple instances of the waveform in the analog output signal.

13. The method of claim 12, further comprising:
  generating the analog repetitive signal.

14. The method of claim 12, further comprising:
  receiving a trigger signal synchronized with a start of at least one waveform of the analog repetitive signal, wherein the timing alignment is based on the trigger signal.

15. The method of claim 12, wherein generating the timing alignment comprises:
  generating a timing information comprising a start time of at least one waveform of the analog repetitive signal, wherein generating the discrete set of analog dither offset voltages is based on the timing information.

16. The method of claim 12, wherein averaging the multiple instances of the waveform uses a combination of fixed-point arithmetic and floating-point arithmetic.

17. The method of claim 12, wherein the analog dither offset voltage is different between consecutive instances of the waveform.

18. The method of claim 12, wherein the analog dither offset voltage is substantially constant for M consecutive instances of the waveform, wherein M is a positive integer that is less than a number of the multiple instances of the waveform.

19. The method of claim 12, wherein the analog dither offset voltages are monotonically increasing, monotonically decreasing, or randomized.

20. An apparatus for improving digitization of an analog repetitive signal, comprising:
  means for generating a discrete set of analog dither offset voltages, wherein at least two analog dither offset voltages of the discrete set of analog dither offset voltages are different from each other;
  means for summing two signals configured to:
    receive the analog repetitive signal comprising multiple instances of a waveform, wherein the waveform has a waveform duration,
    receive the discrete set of analog dither offset voltages, wherein each analog dither offset voltage is substantially constant over the waveform duration, and
    combine each waveform and the corresponding analog dither offset voltage over the waveform duration based on a timing alignment;
  means for generating the timing alignment to align each waveform of the analog repetitive signal and the corresponding analog dither offset voltage over the waveform duration;
  means for converting an analog signal to a digital signal configured to receive an analog output signal from the means for summing and convert the analog output signal to a digital output signal; and
  means for averaging configured to receive the digital output signal and produce, based on the timing alignment, a digital averaged signal.

* * * * *